(12) United States Patent
Ponomarev (10) Patent No.: US 7,691,695 B2
(45) Date of Patent: Apr. 6, 2010

(54) SEMICONDUCTOR DEVICE HAVING STRIP-SHAPED CHANNEL AND METHOD FOR MANUFACTURING SUCH A DEVICE

(75) Inventor: Youri V Ponomarev, Leuven (BE)

(73) Assignee: NXP B.V., Eindhoven (NL)

( * ) Notice: Subject to any disclaimer, the term of this patent is extended or adjusted under 35 U.S.C. 154(b) by 232 days.

(21) Appl. No.: 11/813,015

(22) PCT Filed: Dec. 19, 2005

(86) PCT No.: PCT/IB2005/054306

§ 371 (c)(1),
(2), (4) Date: Jun. 28, 2007

(87) PCT Pub. No.: WO2006/070309

PCT Pub. Date: Jul. 6, 2006

(65) Prior Publication Data

US 2008/0203476 A1    Aug. 28, 2008

(30) Foreign Application Priority Data

Dec. 28, 2004    (EP) ................................. 04107020

(51) Int. Cl.
*H01L 21/336* (2006.01)
(52) U.S. Cl. ............................ 438/197; 257/E27.099; 257/401
(58) Field of Classification Search ............... 257/401, 257/E27.099; 438/197
See application file for complete search history.

(56) References Cited

U.S. PATENT DOCUMENTS 5,338,959 A * 8/1994 Kim et al. ................... 257/331
5,497,019 A * 3/1996 Mayer et al. ................ 257/347

(Continued)

OTHER PUBLICATIONS

FINFET—A Self-Aligned Double-Gate MOSFET Scalable to 20 NM IEEE Transactions on Electron Devices, vol. 47, No. Dec. 12, 2000 pp. 2320-2325 Hisamoto et al.

(Continued)

*Primary Examiner*—Thao P. Le (57) ABSTRACT

The invention relates to a semiconductor device (10) consisting of a substrate (11) and a semiconductor body (2) comprising a strip-shaped semiconductor region (3,3A,3B) of silicon in which a field effect transistor is formed, wherein a source region (4) of a first conductivity type, a channel region (33) of a second conductivity type opposed to the first, and a drain region (5) of the first conductivity type are arranged in succession, successively, seen in the longitudinal direction of the strip-shaped semiconductor region (3,3A,3B), and wherein the channel region (33) is provided with a gate dielectric (6), on which a first gate electrode (7) is present on a first vertical side of the strip-shaped semiconductor region (3,3A,3B), which gate electrode (7) is provided with a first connection region (7A), and on which a second gate electrode (8) is present on a second vertical side of the strip-shaped semiconductor region (3,3A,3B) positioned opposite the first vertical side, which second gate electrode (8) is provided with a second connection region (8A). According to the invention the first and second gate electrodes (7,8) completely fill the space on either side of the strip-shaped semiconductor region (3,3A,3B) over the width of the connection regions (7A,8A). In a preferred embodiment the gate electrodes (7,8) each border a horizontal side of the strip-shaped semiconductor region (3,3A,3B). The device (10) according to the invention is very compact, suitable for the sub 45 nm domain and easy to manufacture.

16 Claims, 6 Drawing Sheets

U.S. PATENT DOCUMENTS

| | | | |
|---|---|---|---|
| 5,757,038 A * | 5/1998 | Tiwari et al. | 257/192 |
| 5,801,397 A * | 9/1998 | Cunningham | 257/66 |
| 6,335,214 B1 | 1/2002 | Fung | |
| 6,433,609 B1 | 8/2002 | Voldman | |
| 6,800,885 B1 * | 10/2004 | An et al. | 257/275 |
| 2002/0090758 A1 * | 7/2002 | Henley et al. | 438/110 |
| 2003/0061687 A1 * | 4/2003 | Hansen et al. | 23/295 R |
| 2003/0151077 A1 | 8/2003 | Mathew et al. | |
| 2004/0217430 A1 | 11/2004 | Chu | |
| 2006/0022264 A1 * | 2/2006 | Mathew et al. | 257/331 |

OTHER PUBLICATIONS

Technological Challenges of Advanced CMOS Proceeding and Their Impact on Design Aspects VLSI Design, 2004. Proceedings. 17th International Conference on Mumbai, India Jan. 5-9, 2004, Los Alamitos, CA. USA, IEEE Computer Society, USA pp. 275-282 Claeys, C.

* cited by examiner

SEMICONDUCTOR DEVICE HAVING STRIP-SHAPED CHANNEL AND METHOD FOR MANUFACTURING SUCH A DEVICE

The invention relates to a semiconductor device consisting of a substrate and a semiconductor body comprising a strip-shaped semiconductor region of silicon in which a field effect transistor is formed, wherein a source region of a first conductivity type, a channel region of a second conductivity type opposed to the first, and a drain region of the first conductivity type are arranged in succession, seen in the longitudinal direction of the strip-shaped semiconductor region, and wherein the channel region is provided with a gate dielectric, on which a first gate electrode is present on a first vertical side of the strip-shaped semiconductor region, which gate electrode is provided with a first connection region, and on which a second gate electrode is present on a second vertical side of the strip-shaped semiconductor region positioned opposite the first vertical side of the strip-shaped semiconductor region, which second gate electrode is provided with a second connection region. The invention also relates to a method of manufacturing such a device. The term vertical as used in this application is understood to mean a direction perpendicular to the substrate, and the term horizontal is understood to mean a direction parallel to the substrate.

Such a device, also called FinFet (=Fin Field Effect Transistor), is considered to be a very useful, if not necessary, element in the architecture of future CMOS (=Complementary Metal Oxide Semiconductor) technology in the sub 45 nm domain. The presence of an additional gate electrode around a sufficiently thin and narrow silicon semiconductor region enables total electrostatic control over the channel carriers by the gate electrodes, as a result of which the risk of so-termed "short channel" effects is reduced. Such effects have a very disadvantageous influence on various relevant transistor properties.

Such a device and method are known from US patent US 2003/0151077 A1, which was published on Aug. 14, 2003. Said patent specification (see FIG. 9, for example) shows a field effect transistor which is formed of a strip-shaped silicon region present on a so-termed SOI (=Silicon On Insulator) substrate and which comprises two gate electrodes disposed on either side of the strip-shaped semiconductor region. Present on either side of the two gate electrodes, seen in the longitudinal direction of the strip-shaped semiconductor region, are the source and drain regions. Present on the electrically insulating layer of the SOI substrate, on either side of the strip-shaped semiconductor region, are the connection regions of the two gate electrodes.

A drawback of the known device is the fact that it is not easy to make it sufficiently small in size. This problem obtains in particular if the device comprises a larger number of mutually parallel strip-shaped semiconductor regions. Such a multiple Finlet, in which a (the) gate electrode(s) is (are) connected to a large number of strip-shaped semiconductor regions that are connected to the same source and drain region connections, is very desirable for obtaining a sufficiently high current-carrying capacity per unit area.

The object of the present invention is therefore to provide a device which does not exhibit the aforesaid drawback, or at least not to the same extent, and which can be made very small in size, in particular if it is a multiple Finlet.

In order to achieve that object, a device of the kind referred to in the introduction is according to the invention characterized in that the first and the second gate electrode completely fill the space on either side of the strip-shaped semiconductor region over the width of the connection regions. The invention is based on the perception that in the known device that positioning of the connection regions stands in the way of realising a device of very small dimensions. On the one hand, the photolithographic step that is used takes up too much surface area. On the other hand, such a step is critical because of the fact that the known device does not have a flat structure. By forming the two gate electrodes up to, respectively, the upper side and the lower side of the strip-shaped semiconductor region, the difference in height in the device is on the one hand removed at the critical locations, whilst on the other hand such a quasi-planar structure at least of the part of the gate electrode that is located on either side of the strip-shaped semiconductor region provides more space for positioning the connection regions. This, too, enables an easy electrical connection of the connection regions without a larger device being required.

The invention is furthermore based on the perception that several attractive methods of manufacturing a device according to the invention are possible. In the first place it is possible to realise the manufacture of a device according to the invention—using the same manufacturing method as for the known device—without any additional process steps being required. By selecting a sufficiently large thickness for the conductive layer of which the gate electrodes are formed, i.e. so large that the upper side of the conductive layer is positioned higher than the upper side of the strip-shaped semiconductor region, the desired object can be readily achieved. In the CMP (=Chemical Mechanical Polishing) process that is used, which process is used for forming the individual gate electrodes in the known method, also the connection regions of the gate electrodes are formed, in a self-registering manner, as it were, as forming part thereof.

The invention is furthermore based on the perception that if . . . , very advantageous results are achieved in the manufacture of a device according to the invention by means of a substrate transfer technique. All this will be explained in more detail below in the description of an embodiment of the invention.

In a preferred embodiment of a device according to the invention, the first gate electrode extends along a first horizontal side of the strip-shaped semiconductor region, and the second gate electrode extends along an opposite horizontal side of the strip-shaped semiconductor region. Use is made of the fact that all this need not imply that a larger surface area is needed. Furthermore, this is the variant in which a substrate transfer technique can be used very advantageously for manufacturing the device according to the invention.

An advantageous variant is characterized in that the strip-shaped semiconductor region is provided with a recess at the location of the channel region, in which recess the second gate electrode is present. On the one hand the two gate electrodes thus take up a small surface area, whilst on the other hand the transistor can be designed to have a small and, especially in vertical directions, symmetrical channel region. This latter fact has a positive effect on the transistor properties as well.

Preferably, the semiconductor body comprises a number of mutually parallel strip-shaped semiconductor regions. In this way a so-termed multiple Finlet having an advantageous current-carrying capacity is obtained. Furthermore, the advantages of the invention and the ease of manufacture of the device become fully evident in this embodiment.

Advantageously, a periodicity can be introduced in the longitudinal direction of the strip-shaped semiconductor region(s). This implies that the (each) strip-shaped semiconductor region comprises a number of field effect transistors arranged beside each other, seen in the longitudinal direction of the strip-shaped semiconductor region, and that also the gate electrodes may have an interdigited structure, therefore. Such a structure is very compact and enables a high component density.

As already noted before, it is preferred to use a substrate transfer technique for manufacturing the device according to the invention.

A method of manufacturing a semiconductor device consisting of a substrate and a semiconductor body comprising a strip-shaped semiconductor region of silicon in which a field effect transistor is formed, wherein a source region of a first conductivity type, a channel region of a second conductivity type opposed to the first, and a drain region of the first conductivity type are arranged in succession, seen in the longitudinal direction of the strip-shaped semiconductor region, and wherein the channel region is provided with a gate dielectric, on which a first gate electrode is formed on a first vertical side of the strip-shaped semiconductor region, which gate electrode is provided with a first connection region, and on which a second gate electrode is formed on a second vertical side of the strip-shaped semiconductor region positioned opposite the first vertical side of the strip-shaped semiconductor region, which second gate electrode is provided with a second connection region, is according to the invention characterized in that the first and second gate electrodes are configured to completely fill the space on either side of the strip-shaped semiconductor region over the width of the connection regions. In this way a method according to the invention is obtained in a simple manner.

In a preferred embodiment, the first gate electrode is configured to extend along a first horizontal side of the strip-shaped semiconductor region, and the second gate electrode is configured to extend along an opposite horizontal side of the strip-shaped semiconductor region. Preferably, a substrate transfer technique is used for forming the device. Preferably, a further substrate is provided on the semiconductor body after the formation of the first gate electrode on the gate dielectric overlying the strip-shaped semiconductor region, and after removal of the substrate the second gate electrode is formed on the side where the substrate was present.

Preferably, the connection regions of the gate electrodes are provided with electrical connecting conductors on the same side of the device. This is readily possible also with a device manufactured by means of a substrate transfer technique and has significant advantages.

The invention will now be explained in more detail with reference to an embodiment and the drawing, in which:

FIG. 1 is a schematic top plan view of an embodiment of a semiconductor device according to the invention, and FIGS. 2-10 are schematic cross-sectional views, seen in a direction perpendicular to the thickness direction of the device of FIG. 1, which show successive stages of the manufacture thereof by means of an embodiment of a method according to the invention.

The figures are not drawn to scale, and some dimensions, such as the dimensions in the thickness direction, are exaggerated for the sake of clarity. Corresponding areas or parts are as much as possible indicated by the same numerals in the various figures.

Figure 1A:
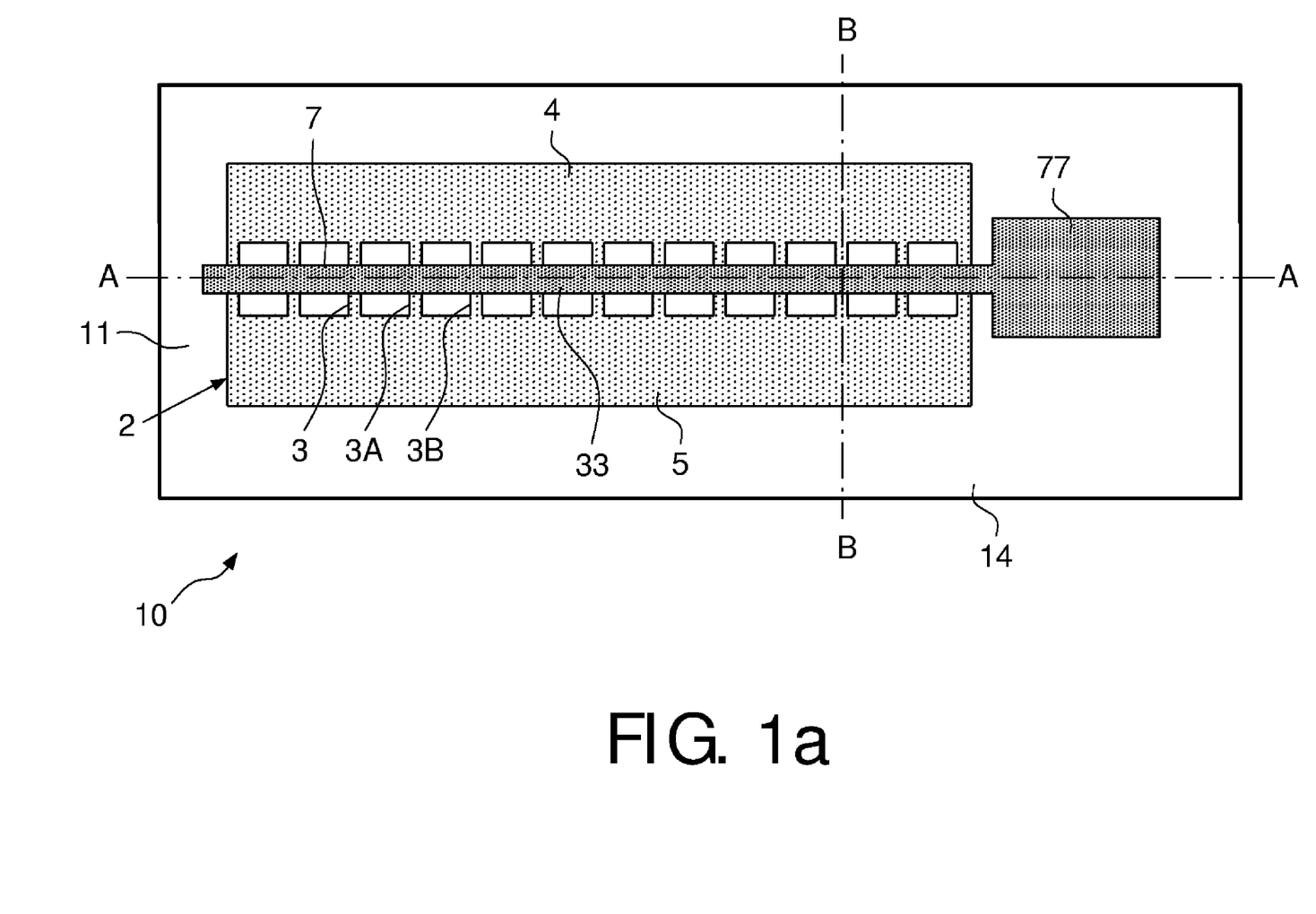
Figure 1B:
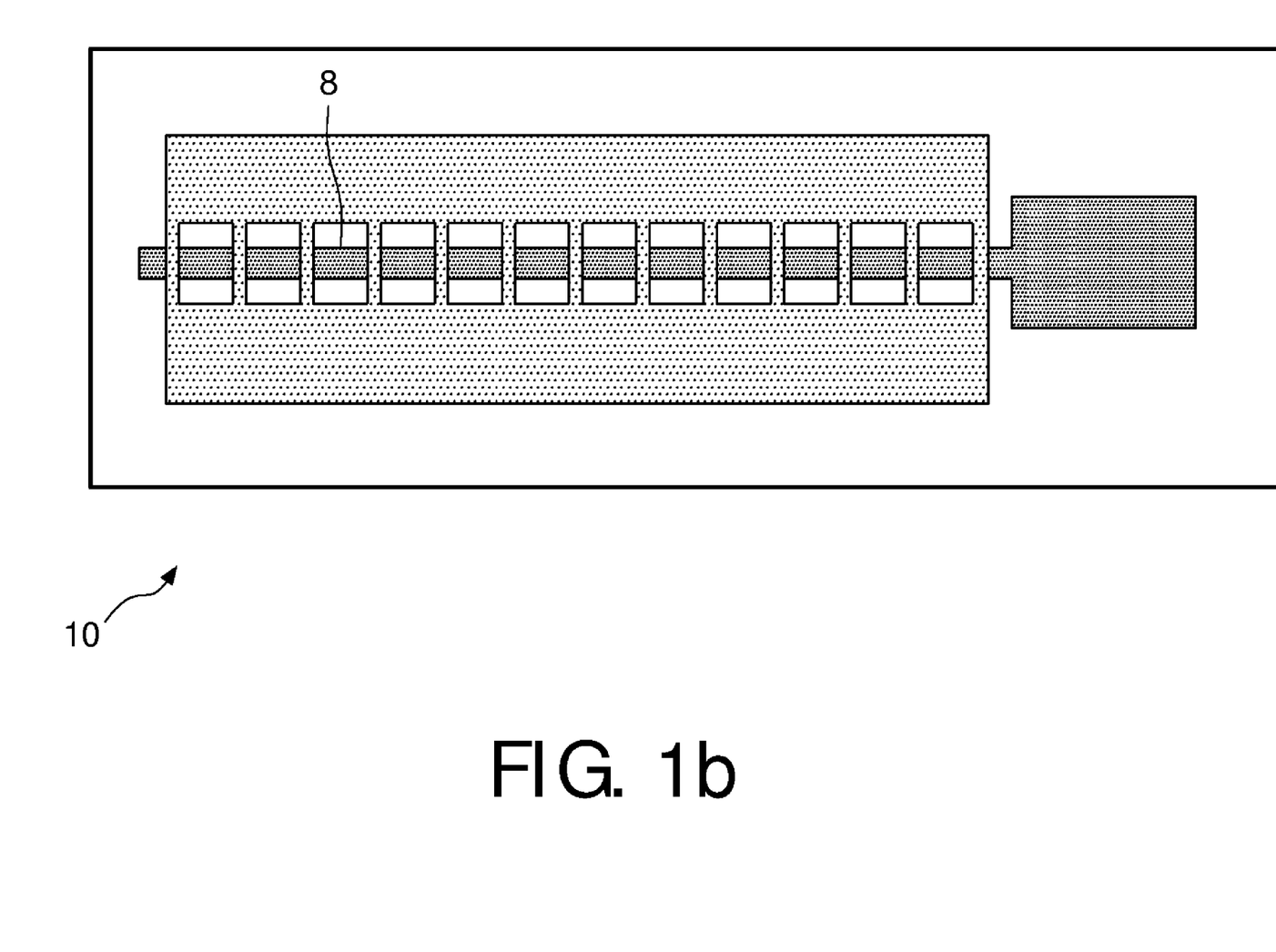
Figure 2A:
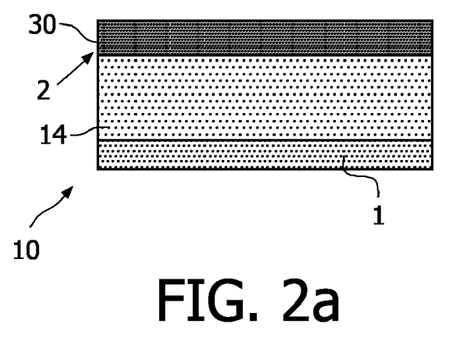
Figure 2B:
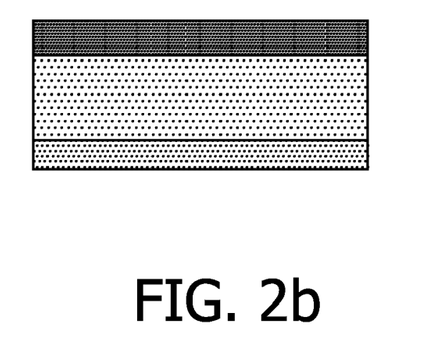
Figure 3A:
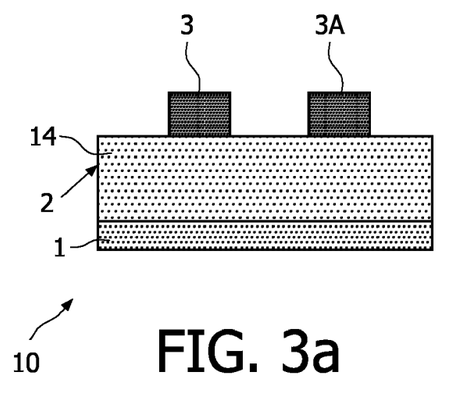
Figure 3B:
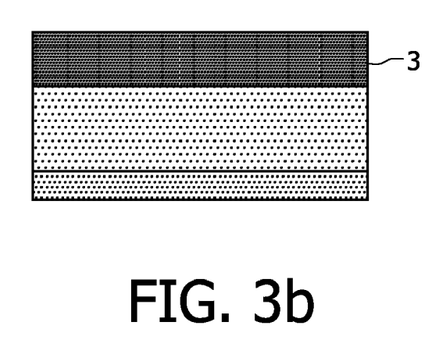
Figure 4A:
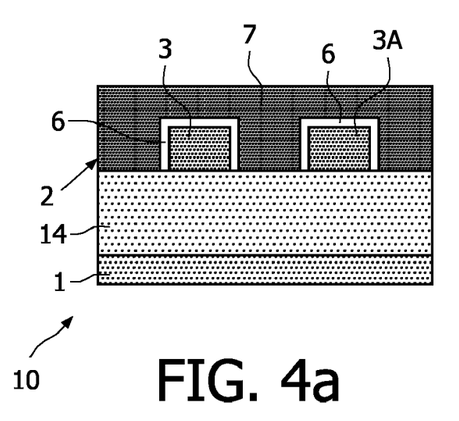
Figure 4B:
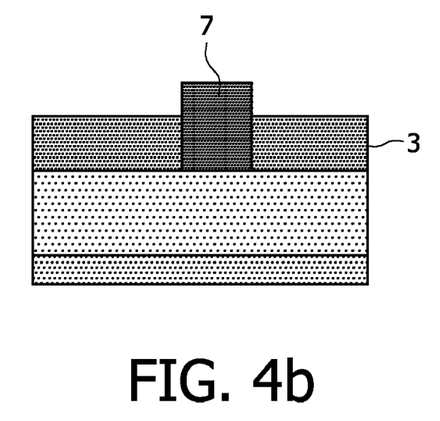
Figure 5A:
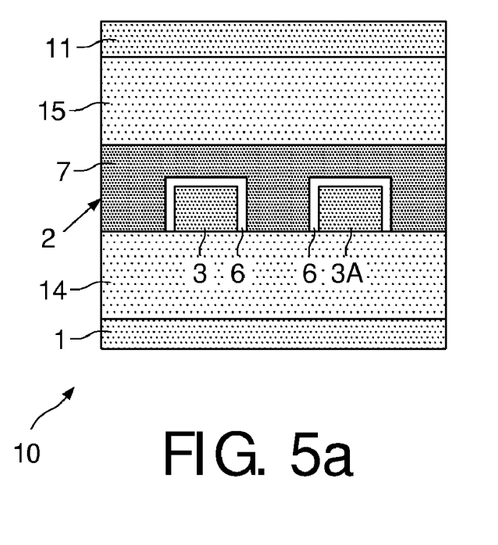
Figure 5B:
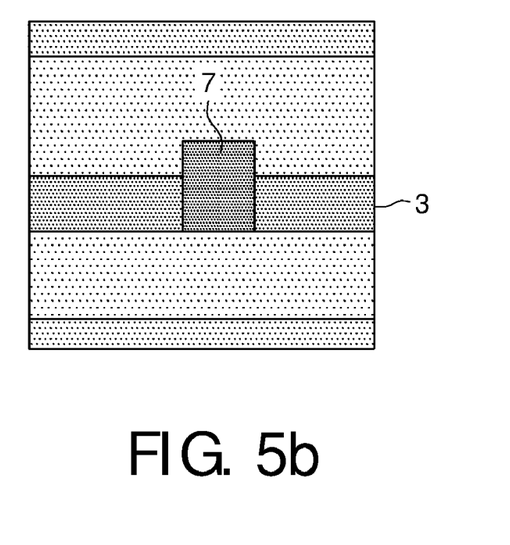

FIG. 1 schematically shows in top plan view an embodiment of a semiconductor device according to the invention. The device 10 that is shown in this example comprises a substrate 11 (see FIG. 1a), in this case consisting of p-type silicon, which is coated with an electrically insulating layer 14, of silicon dioxide in this embodiment, and a semiconductor body 2 overlying said layer. Said semiconductor body comprises a source region 4, an n-type source region in this embodiment, and a (likewise n-type) drain region 5, which are interconnected by means of a strip-shaped semiconductor region (a number of semiconductor regions in this embodiment) 3,3A,3B, which form p-type channel regions 33 of a field effect transistor. The strip-shaped semiconductor regions are provided with a first gate electrode 7 and a second gate electrode 8 (see the top plan view in FIG. 1b, from which the first gate electrode 7 has been left out for the sake of clarity), which are electrically separated from each other and which surround each semiconductor region 3,3A,3B practically entirely. This enables a total electrostatic control over the charge carriers in the channel of the field effect transistor, as a result of which so-termed short-channel effects are prevented and the transistor has excellent properties also if the lateral dimensions of the channel regions 33 are very small, for example in the order of a few dozen nm. A special advantage of the transistor according to the invention is the fact that it is easy to manufacture when using a method according to the invention.

The transistor of this example forms a multiple FinFet, with each of the strip-shaped semiconductor regions 3,3A,3B forming a separate FinFet, as it were. As a result, the transistor has a sufficiently large current-carrying capacity per unit area. The lateral dimensions of each channel region 33 are about 10 nm (width) and about 60 nm (height) in this example. The length of each strip-shaped region 3,3A,3B is about 75 nm (25 nm for each of the source, drain and gate electrode portions), and the spacing between adjacent strip-shaped regions 3,3A is 50 nm.

Further details of the device 10 of this example will be discussed below in the discussion of the manufacture of the device 10 by means of an embodiment of a method according to the invention.

FIGS. 2-10 are schematic cross-sectional views, seen in a direction perpendicular to the thickness direction of the device of FIG. 1, which show successive stages of the manufacture thereof by means of an embodiment of a method according to the invention. FIG. 1a of each of the FIGS. 2-10 is a cross-sectional view along the line AA in FIG. 1a, whilst FIG. 1b is a cross-sectional view along the line BB in FIG. 1b. The starting point (see FIG. 2) is a p-type silicon substrate 11 coated with an electrically insulating layer 14 of silicon dioxide, on which a p-type silicon semiconductor layer 30 is present. In this example, the above structure is realized by implanting oxygen into a p-type substrate, resulting in an SOI (=Silicon On Insulator) structure as described above. The structure can also be obtained in another manner, however, for example by using a substrate transfer process, starting from an oxidized silicon substrate on which a further silicon substrate is placed, whose thickness is subsequently reduced.

Then (see FIG. 3) strip-shaped semiconductor regions 3,3A are formed in the silicon semiconductor layer 30 by photolithography and etching. In this example, a large number of such regions 3,3A are formed, for example 1 to 100, in this case 10 regions. For the sake of simplicity, only two such regions are shown in the drawing. At the same time (as FIG. 1a shows) further semiconductor regions 4,5 are formed, which function as the source region 4 and the drain region 5 of the transistor to be formed. An n-type implant may have been introduced into the semiconductor a layer 30 at the location of said regions 4, 5, which implant may also partially extend into the strip-shaped regions 3,3A to be formed, so that the channel region 5 of the transistor is only formed in part of each strip-shaped region 3,3A.

Following this (see FIG. 4), the vertical lateral surfaces and the horizontal upper surface of the strip-shaped regions 3,3A are provided with a gate dielectric 6. Then a conductive layer is deposited, from which a first gate electrode 7 is formed (see FIG. 1) by photolithography and etching. The gate electrode 7 is made of polycrystalline silicon in this case, but it may also contain a metal. The gate electrode (layer) 7 is planarized by means of CMP.

Figure 6A:
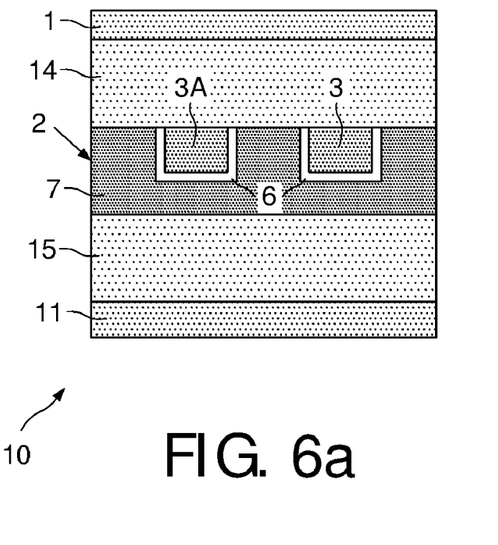
Figure 6B:
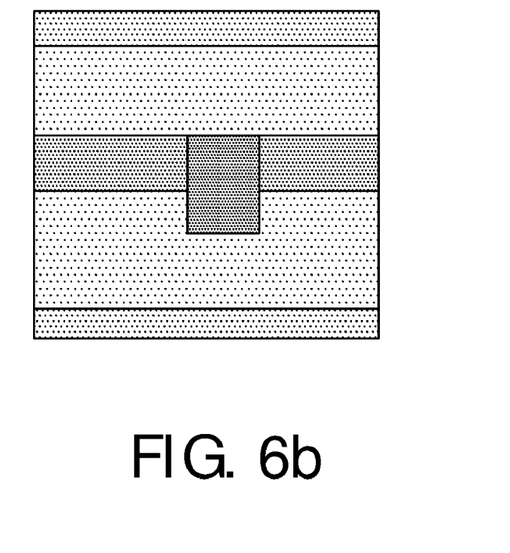
Figure 7A:
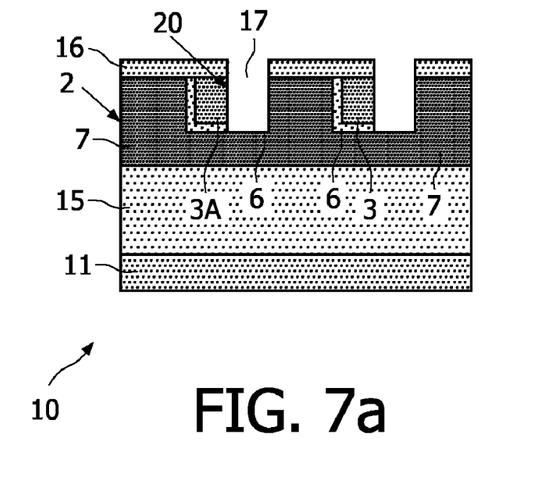
Figure 7B:
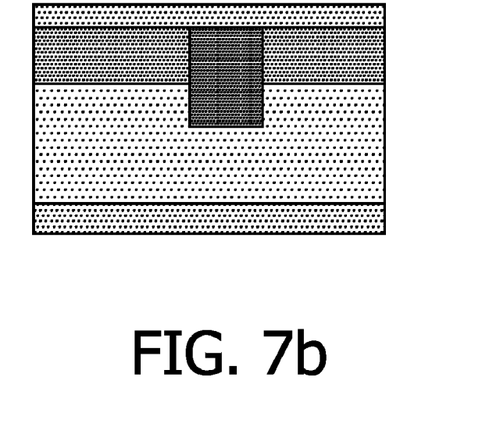
Figure 8A:
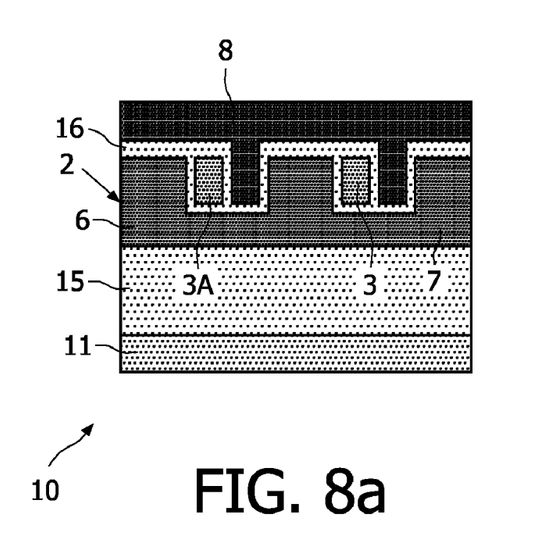
Figure 8B:
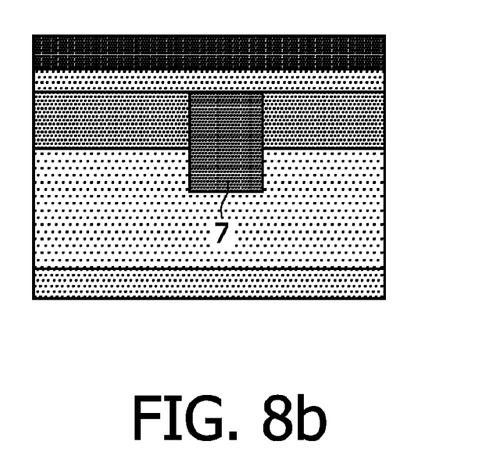
Figure 9A:
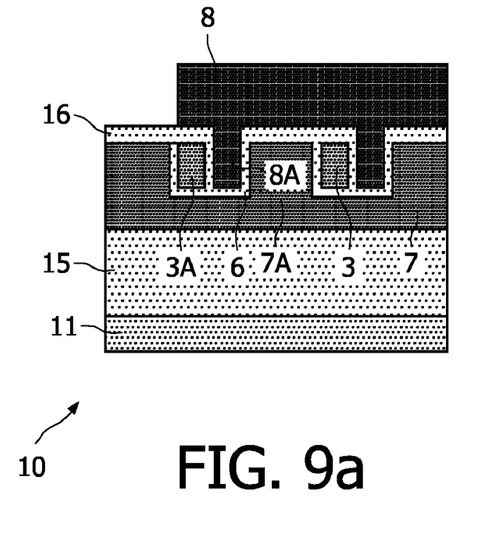
Figure 9B:
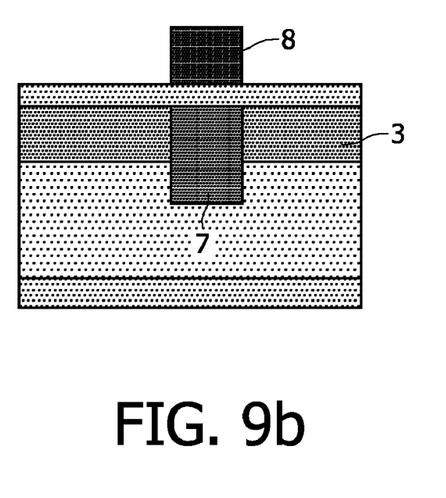
Figure 10A:
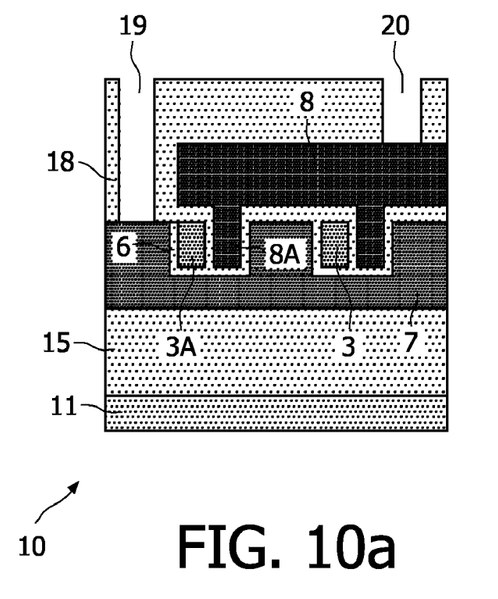
Figure 10B:
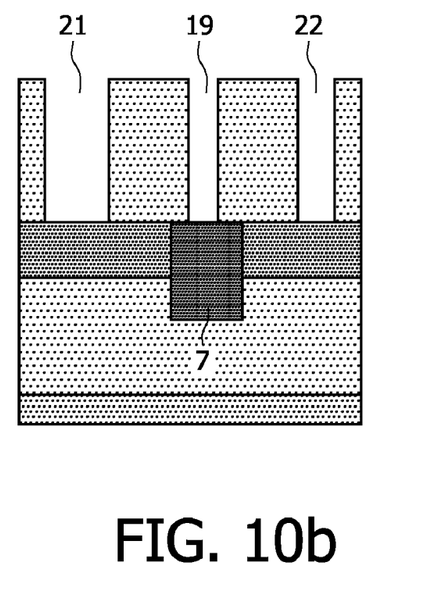

Then (see FIG. 5) an electrically insulating layer 15 of silicon dioxide is deposited on the gate electrode 7, in this case by CVD (=Chemical Vapour Deposition). After that, a further p-type silicon substrate 11 is provided by means of a substrate transfer process. This result can also be achieved by forming an insulating layer 15 on a silicon substrate 11, for example by thermal oxidation, and arranging the whole on top of the first gate electrode 7. The situation after the device 10 has been turned through an angle of 180 degrees in the plane of the drawing is shown in FIG. 6.

After this (see FIG. 7) the substrate 1 is removed, for example by grinding, CMP or etching, or a combination of two or more of such techniques. The same goes for the insulating layer 14, which can be etched by means of an aqueous solution of HF, for example. Following this, a hard masking layer 16 is formed, for example of silicon dioxide, which is patterned by photolithography and etching. The masking layer 16 is provided with (rectangular) openings 17, which are aligned on the strip-shaped semiconductor regions 3,3A and whose width is about half the width of the semiconductor regions. To that end the device may be provided with alignment characteristics in advance, for example in or near the insulating layer 14. Then about half of each strip-shaped semiconductor region 3,3A is locally removed by etching, so that each strip-shaped semiconductor region 3,3A,3B is locally provided with a recess 20. If desired, part of the gate dielectric 6 can be removed at this stage and be formed anew.

Then (see FIG. 8) the device 10 is provided with the second gate electrode 8. Poly Si or a metal may be selected as the material for said electrode 8 as well, and this electrode 8 too is planarized, for example by CMP.

Subsequently (see FIG. 9) the second gate electrode 8 is patterned by photolithography and etching. The figure clearly shows how the first gate electrode 7 completely fills the space beside the strip-shaped semiconductor region 3 over the width of the connection region 7A. The same goes for the gate electrode 8 and the connection region 8A thereof beside the strip-shaped semiconductor region 3A. This figure also shows clearly how the strip-shaped semiconductor regions 3,3A are surrounded substantially entirely by the gate electrodes 7,8—which are electrically interconnected or electrically insulated from each other—as a result of which an excellent control of the so-called short-channel effects in the transistor thus obtained can be achieved.

Finally (see FIG. 10) an electrically insulating layer 18, for example of silicon dioxide, is deposited on the surface of the device 10, for example by CVD. Said layer is provided with contact openings 19,20 by photolithography and etching for the deposition of a connecting conductor (not shown) for the first gate electrode 7 and the second gate electrode 8, respectively. Contact openings 21,22 are used for providing a connecting conductor to the source region 4 and the drain region 5. The connecting conductors can be led to so-termed bond pads, such as the bond pad 77 for the first gate electrode 7 (see FIG. 1a). Individual devices 10 can be obtained by using a separation technique, such as sawing or etching.

The invention is not limited to the embodiments as shown herein, as many variations and modifications are possible within the scope of the invention to those skilled in the art. Thus the invention may be used not only in a CMOS but also in a Bi(C)MOS (=Bipolar (Complementary) Metal Oxide Semiconductor) IC (=Integrated Circuit). The invention can be used for PMOS transistors as well as for NMOS transistors.

It is noted that the structure of the device as shown in FIG. 1a may also be periodically implemented in the direction BB. In that case the strip-shaped semiconductor regions 3,3A,3B may comprise a larger number of individual MOSFET's in that direction, which each have a common source and drain region.

It is furthermore noted that it is not necessary to use a local recess in the strip-shaped semiconductor region. Instead thereof, the second gate electrode may fill the entire space between two strip-shaped semiconductor regions, whilst the first gate electrode will fill the space between the two next strip-shaped semiconductor regions in that case. The alignment step that is critical for the formation of the structure can be less critical in that case.

Many variations and modifications are also possible as far as the method according to the invention is concerned. Thus, other deposition techniques and other materials than those used in the example may be used.

The invention claimed is:

1. A semiconductor device consisting of a substrate and a semiconductor body comprising a strip-shaped semiconductor region of silicon in which a field effect transistor is formed, wherein the strip-shaped semiconductor region has a first vertical side, a second vertical side, a first horizontal side, and a second horizontal side, wherein the second vertical side of the strip-shaped semiconductor region is positioned opposite to the first vertical side of the strip-shaped semiconductor region, wherein a source region of a first conductivity type, a channel region of a second conductivity type opposed to the first conductivity type, and a drain region of the first conductivity type are arranged in succession, seen in the longitudinal direction of the strip-shaped semiconductor region, wherein the channel region is provided with a gate dielectric on which a first gate electrode and a second gate electrode are located, wherein the first gate electrode is present at the first vertical side of the strip-shaped semiconductor region and is provided with a first connection region, and wherein the second gate electrode is present at the second vertical side of the strip-shaped semiconductor region and is provided with a second connection region, characterized in that the first and the second gate electrode completely fill spaces at either side of the strip-shaped semiconductor region over the width of the connection regions.

2. A semiconductor device as claimed in claim 1, characterized in that the first gate electrode further extends over the strip-shaped semiconductor region along the first horizontal side thereof, and in that the second gate electrode further extends over the strip-shaped semiconductor region along the second horizontal side thereof, wherein the second horizontal side of the strip-shaped semiconductor region is located opposite to said first horizontal side of the strip-shaped semiconductor region.

3. A semiconductor device as claimed in claim 1, characterized in that the strip-shaped semiconductor region is provided with a recess at the location of the channel region, wherein the second gate electrode is present in the recess.

4. A semiconductor device as claimed in claim 1, characterized in that the semiconductor body comprises a number of mutually parallel strip-shaped semiconductor regions.

5. A semiconductor device as claimed in claim 1, characterized in that the strip-shaped semiconductor region comprises a number of field effect transistors arranged beside each other, seen in the longitudinal direction of the strip-shaped semiconductor region.

6. A semiconductor device as claimed in claim 1, characterized in that the semiconductor device is manufactured by means of a substrate transfer technique.

7. A method of manufacturing a semiconductor device consisting of a substrate and a semiconductor body, the method comprising:
- forming a strip-shaped semiconductor region of silicon, wherein the strip-shaped semiconductor region has a first vertical side, a second vertical side, a first horizontal side, and a second horizontal side, wherein the second vertical side of the strip-shaped semiconductor region is positioned opposite to the first vertical side of the strip-shaped semiconductor region;
- forming a source region of a first conductivity type, a channel region of a second conductivity type opposed to the first conductivity type, and a drain region of the first conductivity type are arranged in succession in the longitudinal direction of the strip-shaped semiconductor regions;
- providing a gate dielectric to the channel region;
- forming a first gate electrode at the first vertical side of the strip-shaped semiconductor region;
- providing a first connection region to the first gate electrode;
- forming a second gate electrode at the second vertical side of the strip-shaped semiconductor region; and
- providing a second connection region to the second gate electrode, characterized in that the first and the second gate electrode completely fill spaces at either side of the strip-shaped semiconductor region over the width of the connection regions.

8. A method as claimed in claim 7, characterized in that the first gate electrode extends over the strip-shaped semiconductor region along the first horizontal side thereof, and in that the second gate electrode extends over the strip-shaped semiconductor region along the second horizontal side thereof, wherein the second horizontal side of the strip-shaped semiconductor region is located opposite to said first horizontal side of the strip-shaped semiconductor region.

9. A method as claimed in claim 7 further comprising providing a further substrate on the semiconductor body after forming the first gate electrode on the gate dielectric, and removing the substrate after forming the second gate electrode.

10. A method as claimed in claim 7 further comprising providing electrical connecting conductors to the connection regions of the gate electrodes, wherein the electrical connecting conductors are at the same side of the semiconductor device.

11. The semiconductor device of claim 1, wherein the first vertical side and the second vertical side of the strip-shaped semiconductor region are in a direction that is perpendicular to the substrate.

12. The semiconductor device of claim 1, wherein the first horizontal side and the second horizontal side of the strip-shaped semiconductor region are in a direction that is parallel to the substrate.

13. The semiconductor device of claim 1, wherein the first gate electrode is electrically insulated from the second gate electrode.

14. The method of claim 7, wherein the first vertical side and the second vertical side of the strip-shaped semiconductor region are in a direction that is perpendicular to the substrate.

15. The method of claim 7, wherein the first horizontal side and the second horizontal side of the strip-shaped semiconductor region are in a direction that is parallel to the substrate.

16. The method of claim 7, wherein the first gate electrode is electrically insulated from the second gate electrode.

* * * * *